US012683044B2

(12) United States Patent
Yu et al.

(10) Patent No.: US 12,683,044 B2
(45) Date of Patent: Jul. 14, 2026

(54) BUSH INSERT, BUSH ASSEMBLY INCLUDING THE SAME AND UPPER ELECTRODE ASSEMBLING STRUCTURE INCLUDING THE SAME

(71) Applicant: HANA MATERIALS INC., Chungcheongnam-do (KR)

(72) Inventors: Je Guen Yu, Gyeonggi-do (KR); Yong Uk Kim, Seoul (KR); Je Hee Lee, Gyeonggi-do (KR); Tae Gun Han, Chungcheongnam-do (KR); Eun Young Lee, Chungcheongnam-do (KR); Wang Ki Choi, Chungcheongnam-do (KR)

(73) Assignee: HANA MATERIALS INC., Cheonan-si (KR)

( * ) Notice: Subject to any disclaimer, the term of this patent is extended or adjusted under 35 U.S.C. 154(b) by 350 days.

(21) Appl. No.: 18/509,553

(22) Filed: Nov. 15, 2023

(65) Prior Publication Data

US 2024/0274328 A1 Aug. 15, 2024

(30) Foreign Application Priority Data

Feb. 10, 2023 (KR) ........................ 10-2023-0017762
Jul. 14, 2023 (KR) ........................ 10-2023-0092024

(51) Int. Cl.
*H01B 17/58* (2006.01)
*H01J 37/32* (2006.01)

(52) U.S. Cl.
CPC ...... *H01B 17/583* (2013.01); *H01J 37/32541* (2013.01); *H01J 37/32568* (2013.01)

(58) Field of Classification Search
None
See application file for complete search history.

(56) References Cited

U.S. PATENT DOCUMENTS

| | | | | |
|---|---|---|---|---|
| 5,472,565 A | * | 12/1995 | Mundt | .............. H01J 37/32541 |
| | | | | 204/192.32 |
| 8,161,906 B2 | * | 4/2012 | Kadkhodayan | ... H01J 37/32568 |
| | | | | 156/345.43 |
| 9,773,647 B2 | | 9/2017 | Matsuura et al. | |
| 2009/0236040 A1 | * | 9/2009 | Patrick | .............. C23C 16/45565 |
| | | | | 118/723 VE |
| 2011/0070740 A1 | * | 3/2011 | Bettencourt | ........ H01J 37/3244 |
| | | | | 118/723 MP |

(Continued)

FOREIGN PATENT DOCUMENTS

| | | | | |
|---|---|---|---|---|
| JP | 2022078720 A | | 5/2022 | |
| KR | 101136940 B1 | * | 4/2012 | ........ H01J 37/32532 |
| KR | 101257726 B1 | | 4/2013 | |

(Continued)

OTHER PUBLICATIONS

Original and Translation of JPH11170237 (Year: 1999).*
Original and Translation of KR20220070173 (Year: 2022).*

*Primary Examiner* — Timothy J. Dole
*Assistant Examiner* — Muhammed Azam
(74) *Attorney, Agent, or Firm* — HoustonHogle LLP

(57) ABSTRACT

A bush insert coupled to a plasma electrode plate is configured to provide an insert inner hole that passes through the bush insert in a first direction, an inner surface of the bush insert that defines the insert inner hole is configured to provide a female screw structure, and an outer surface of the bush insert has a non-circular shape in a plan view.

17 Claims, 11 Drawing Sheets

(56)　　　　　　References Cited

U.S. PATENT DOCUMENTS

| | | | | |
|---|---|---|---|---|
| 2014/0217891 A1 * | 8/2014 | Eto | .................. | C23C 16/45565 |
| | | | | 315/111.21 |
| 2023/0032767 A1 | 2/2023 | Park | | |

FOREIGN PATENT DOCUMENTS

| | | | | | |
|---|---|---|---|---|---|
| KR | 101514420 | B1 * | 4/2015 | ........ | H01J 37/32568 |
| KR | 101514397 | B1 * | 7/2015 | ........ | H01J 37/32458 |
| KR | 101547202 | B1 * | 8/2015 | ............ | H01L 21/02 |
| KR | 101593920 | B1 * | 2/2016 | ........ | H01J 37/32541 |
| KR | 101980255 | B1 * | 5/2019 | ........... | H01B 17/301 |
| KR | 102128596 | B1 * | 7/2020 | ........ | H01J 37/32568 |
| KR | 102167800 | B1 * | 10/2020 | ........ | H01J 37/32568 |
| KR | 102168313 | B1 * | 10/2020 | ........ | H01J 37/32568 |
| KR | 102199778 | B1 * | 1/2021 | ........ | H01J 37/32568 |
| KR | 102269883 | B1 | 6/2021 | | |
| KR | 20210067073 | A * | 6/2021 | ........ | H01L 21/3065 |
| KR | 102363315 | B1 * | 2/2022 | ........ | H01J 37/32568 |
| KR | 102363319 | B1 * | 2/2022 | ........ | H01J 37/32559 |
| KR | 102363323 | B1 * | 2/2022 | ........ | H01J 37/32568 |
| KR | 20220070173 | A | 5/2022 | | |
| KR | 102409253 | B1 * | 6/2022 | ........ | H01J 37/32532 |
| KR | 102409256 | B1 * | 6/2022 | ........... | H01L 21/683 |
| KR | 20220076893 | A * | 6/2022 | ........ | H01J 37/32568 |
| KR | 20220090245 | A * | 6/2022 | ............ | C23C 16/50 |
| KR | 20220105592 | A * | 7/2022 | ........ | H01J 37/32568 |
| KR | 20230033495 | A * | 3/2023 | ........ | H01J 37/32568 |
| KR | 20230129738 | A * | 9/2023 | .......... | H01J 37/3244 |
| KR | 20230129739 | A * | 9/2023 | ........ | H01L 21/67069 |
| KR | 20230129740 | A * | 9/2023 | .......... | H01J 37/3244 |
| KR | 20230129741 | A * | 9/2023 | .......... | H01J 37/3244 |
| KR | 102585281 | B1 * | 10/2023 | ........ | H01J 37/32541 |
| KR | 20240106681 | A * | 7/2024 | ........ | H01J 37/32568 |
| KR | 20240106686 | A * | 7/2024 | ........ | H01J 37/32559 |
| TW | 201622036 | A | 6/2016 | | |
| WO | WO2021187756 | A1 | 9/2021 | | |
| WO | WO-2023167459 | A1 * | 9/2023 | ............ | F16B 39/10 |
| WO | WO-2023167460 | A1 * | 9/2023 | ............ | F16B 37/04 |

* cited by examiner

BUSH INSERT, BUSH ASSEMBLY INCLUDING THE SAME AND UPPER ELECTRODE ASSEMBLING STRUCTURE INCLUDING THE SAME

CROSS-REFERENCE TO RELATED APPLICATIONS

This U.S. non-provisional patent application claims priority under 35 U.S.C. § 119 of Korean Patent Application Nos. 10-2023-0017762, filed on Feb. 10, 2023, and 10-2023-0092024, filed on Jul. 14, 2023, the entire contents of which are hereby incorporated by reference.

BACKGROUND

The present disclosure herein relates to a bush insert, a bush assembly including the same, and an upper electrode assembling structure including the same, and more particularly, to a bush insert that is capable of being easily assembled, a bush assembly including the same, and an upper electrode assembling structure including the same.

Semiconductor devices may be manufactured through various processes. For example, semiconductor devices may be manufactured by performing a photo process, an etching process, a deposition process, and the like on a wafer such as silicon. A material that is in a plasma state may be used in each process of manufacturing a semiconductor element. In the process using plasma, an electrode for generating and controlling the plasma may be used within a semiconductor manufacturing equipment. The electrode for the plasma may be disposed at each of upper and lower portions of a chamber. The electrode for the plasma may be provided by coupling a plurality of components.

SUMMARY

The present disclosure provides a bush insert capable of preventing rotation, a bush assembly including the same, and an upper electrode assembling structure including the same.

The present disclosure also provides a bush insert capable of being easily assembled, a bush assembly including the same, and an upper electrode assembling structure including the same.

The object of the present invention is not limited to the aforesaid, but other objects not described herein will be clearly understood by those skilled in the art from descriptions below.

An embodiment of the inventive concept provides a bush insert coupled to a plasma electrode plate, wherein the bush insert is configured to provide an insert inner hole that passes through the bush insert in a first direction, an inner surface of the bush insert that defines the insert inner hole is configured to provide a female screw structure, and an outer surface of the bush insert has a non-circular shape in a plan view.

In an embodiment of the inventive concept, an upper electrode assembling structure includes: a first electrode plate; and a bush assembly coupled to the first electrode plate, wherein the first electrode plate is configured to provide a first insertion hole that is recessed to a predetermined depth downward from a top surface of the first electrode plate, and the bush assembly includes: a bush; and a bush insert coupled to the bush so as to surround the bush, wherein each of the first insertion hole and the bush insert has a rounded square shape in a plan view, and the push insert is inserted into the first insertion hole.

In an embodiment of the inventive concept, a bush assembly includes: a bush insert; and a bush inserted into the bush insert, wherein the bush is configured to provide an internal through-hole that passes through the bush in a first direction, a male screw structure is provided on an outer surface of the bush, the bush insert is configured to provide an insert inner hole that passes through the bush insert in the first direction, an inner surface of the bush insert that defines the insert inner hole is configured to a female screw structure engaged with the male screw structure, an outer surface of the bush insert has a non-circular shape in a plan view, and an outer surface of the bush has a circular shape in the plan view.

Particularities of other embodiments are included in the detailed description and drawings.

BRIEF DESCRIPTION OF THE FIGURES

The accompanying drawings are included to provide a further understanding of the inventive concept, and are incorporated in and constitute a part of this specification. The drawings illustrate embodiments of the inventive concept and, together with the description, serve to explain principles of the inventive concept. In the drawings.

DETAILED DESCRIPTION

Figure 1:
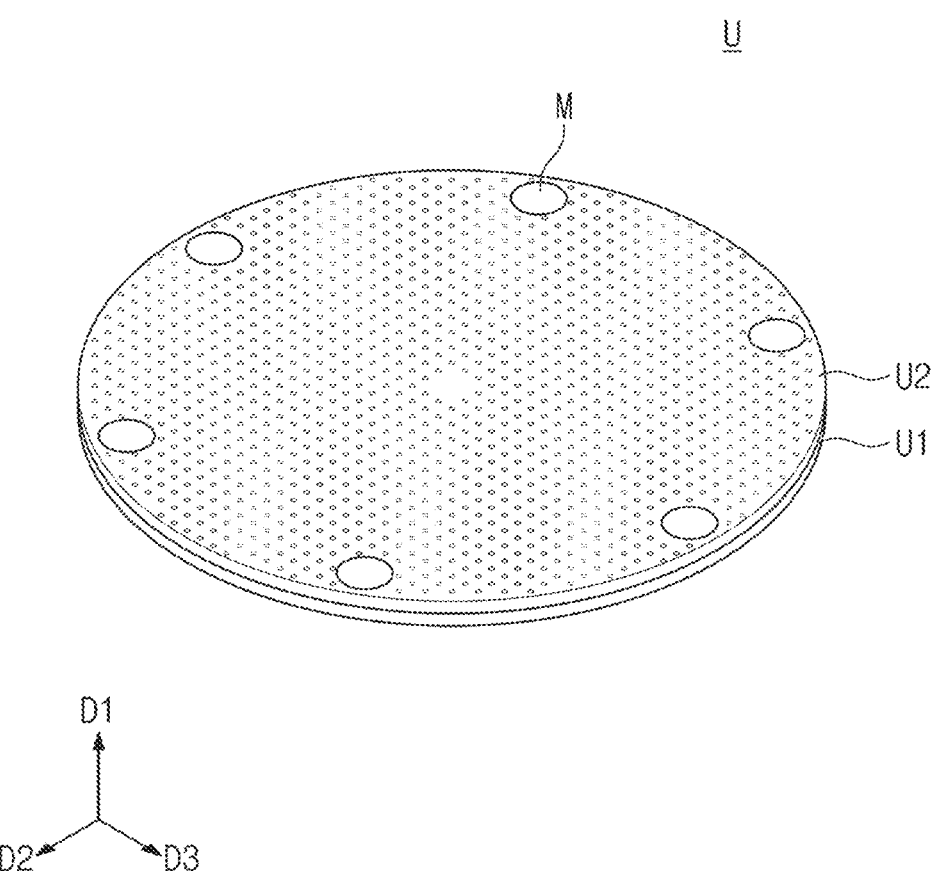
FIG. 1 is a perspective view of an upper electrode assembling structure according to embodiments of the inventive concept.

Advantages and features of the present invention, and implementation methods thereof will be clarified through following embodiments described with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Further, the present invention is only defined by scopes of claims. Like reference numerals refer to like elements throughout.

In the following description, the technical terms are used only for explaining a specific embodiment while not limiting the present invention. In this specification, the terms of a singular form may comprise plural forms unless specifically mentioned. The meaning of 'comprises' and/or 'comprising' specifies a component, a step, an operation and/or an element does not exclude other components, steps, operations and/or elements. Hereinafter, embodiments according to the inventive concept will be described in detail.

Figure 2:
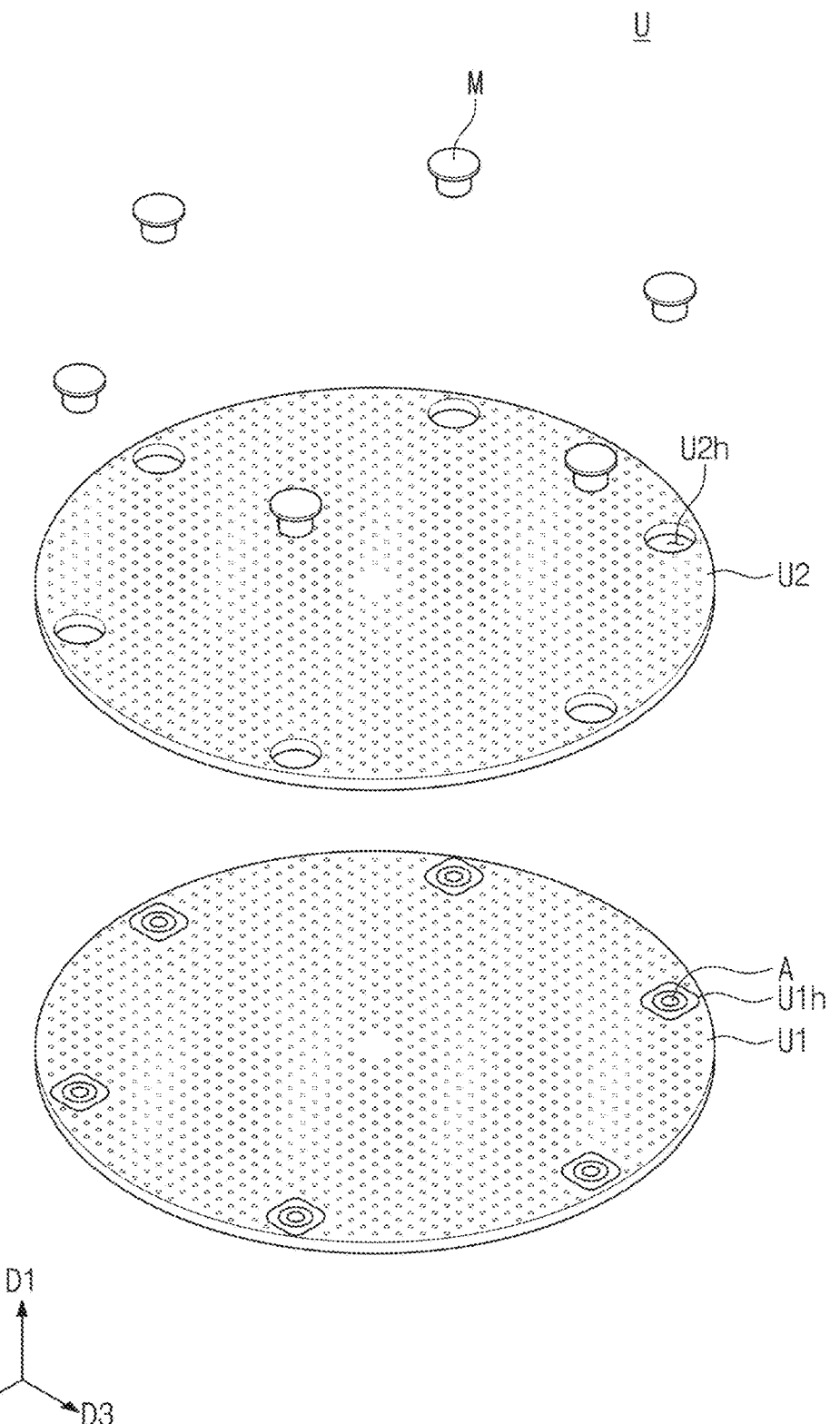
FIG. 2 is a partial exploded perspective view of the upper electrode assembling structure according to embodiments of the inventive concept.

FIG. 1 is a perspective view of an upper electrode assembling structure according to embodiments of the inventive concept, and FIG. 2 is a partial exploded perspective view of the upper electrode assembling structure according to embodiments of the inventive concept.

Hereinafter, a direction D1 in FIG. 1 will be referred to as a first direction, a direction D2 intersecting the first direction D1 will be referred to as a second direction, and a direction D3 intersecting the first direction D1 and the second direction D2 will be referred to as a third direction. Each of the second direction D2 and the third direction D3 may be referred to as a horizontal direction. The first direction D1 may be referred to as a vertical direction. In addition, the first direction D1 may be referred to as an upward direction, and a direction opposite to the first direction D1 may be referred to as a downward direction.

Referring to FIGS. 1 and 2, an upper electrode assembling structure U may be provided. The upper electrode assembling structure U may be installed in a chamber for a process using plasma. For example, the upper electrode assembling structure U may be installed in a chamber for etching a semiconductor. More specifically, the upper electrode assembling structure U may be an electrode installed at a position spaced upward from a lower electrode (not shown) within the etching chamber. The upper electrode assembling structure U may include a first electrode plate U1, a second electrode plate U2, a bush assembly A, and a coupling member M.

The first electrode plate U1 may have a disk shape. The first electrode plate U1 may include a material such as silicon (Si), but is not limited thereto. The first electrode plate U1 may provide a first insertion hole U1$h$ and a microhole (not shown). The first insertion hole U1$h$ may be a hole recessed to a certain depth downward from a top surface of the first electrode plate U1. The first insertion hole U1$h$ may have a rounded square shape in the plan view. Details on this process will be described later. At least a portion of the bush assembly A and the coupling member M may be inserted into the first insertion hole U1$h$. A portion of the bush assembly A and the coupling member M may be inserted into the first insertion hole U1$h$, and thus, the first electrode plate U1 and the second electrode plate U2 may be coupled to each other. The first insertion hole U1$h$ may be provided in plurality. The plurality of first insertion holes U1$h$ may be spaced apart from each other in a circumferential direction. However, hereinafter, unless there are special circumstances, the first insertion hole U1$h$ will be described in singular for convenience. A size of the microhole may be less than that of the first insertion hole U1$h$. A microhole may be a hole through which a process gas passes, but is not limited thereto. The microhole may be provided in plurality.

The second electrode plate U2 may be coupled to the first electrode plate U1. The second electrode plate U2 may have a disk shape. The second electrode plate U2 may include a material such as silicon (Si), but is not limited thereto. The second electrode plate U2 may provide a second insertion hole U2$h$ and a microhole (not shown). The second insertion hole U2$h$ may be a hole punched downward from a top surface of the second electrode plate U2. The second insertion hole U2$h$ may be defined on the first insertion hole U1$h$. A portion of the coupling member M may be inserted into the second insertion hole U2$h$. A portion of the coupling member M may be inserted into the second insertion hole U2$h$, and thus, the first electrode plate U1 and the second electrode plate U2 may be coupled to each other. The second insertion hole U2$h$ may be provided in plurality. The plurality of second insertion holes U2$h$ may be spaced apart from each other in a circumferential direction. However, hereinafter, unless there are special circumstances, the second insertion hole U2$h$ will be described in singular for convenience. A diameter of the microhole may be less than that of the second insertion hole U2$h$. A microhole may be a hole through which a process gas passes, but is not limited thereto. The microhole may be provided in plurality.

The bush assembly A may be inserted into the first insertion hole U1$h$. The bush assembly A may mediate the first electrode plate U1 and the coupling member M. That is, the first electrode plate U1 and the coupling member M may be coupled to each other by the bush assembly A. The bush assembly A may be provided in plurality. For example, the bush assembly A may be provided as many as the first insertion holes U1$h$. However, hereinafter, unless there are special circumstances, the bush assembly A will be described in singular for convenience. Details with respect to the bush assembly A will be described later.

The coupling member M may extend vertically. The coupling member M may be inserted into the first insertion hole U1$h$ and the second insertion hole U2$h$. The coupling member M may couple the first electrode plate U1 to the second electrode plate U2. The coupling member M may be coupled to the bush assembly A within the first insertion hole U1$h$. More specifically, the coupling member M may be inserted into the bush assembly A within the first insertion hole U1$h$. The coupling member M may include a metal. A male screw structure may be provided on an outer circumferential surface of the coupling member M. The coupling member M may be screw-coupled to the bush assembly A. That is, the coupling member M may be a bolt, but is not limited thereto. The coupling member M may be provided in plurality. For example, the coupling members M may be provided as many as the bush assemblies A. However, hereinafter, unless there are special circumstances, the coupling member M will be described in singular for convenience.

Figure 3:
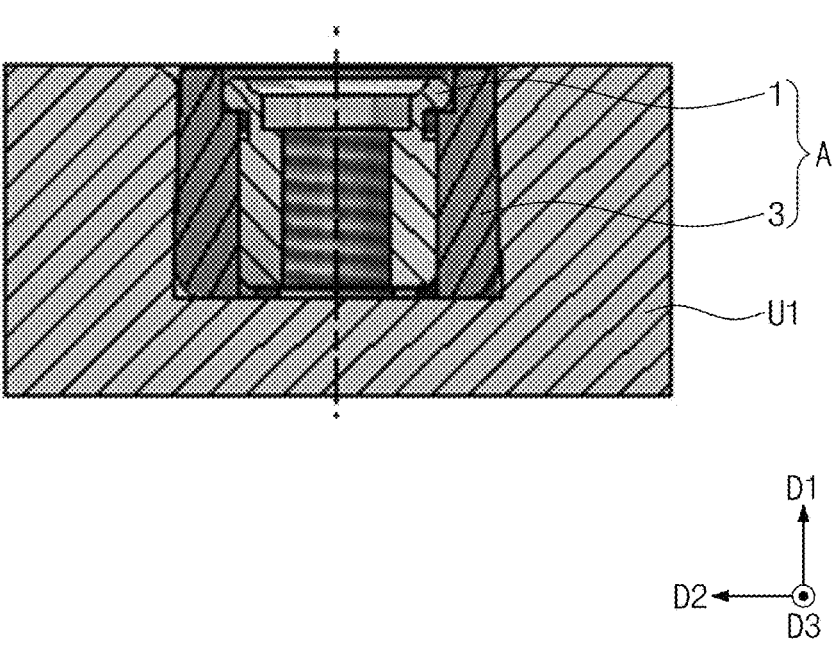
FIG. 3 is a cross-sectional view illustrating a portion of the upper electrode assembling structure according to embodiments of the inventive concept.
Figure 4:
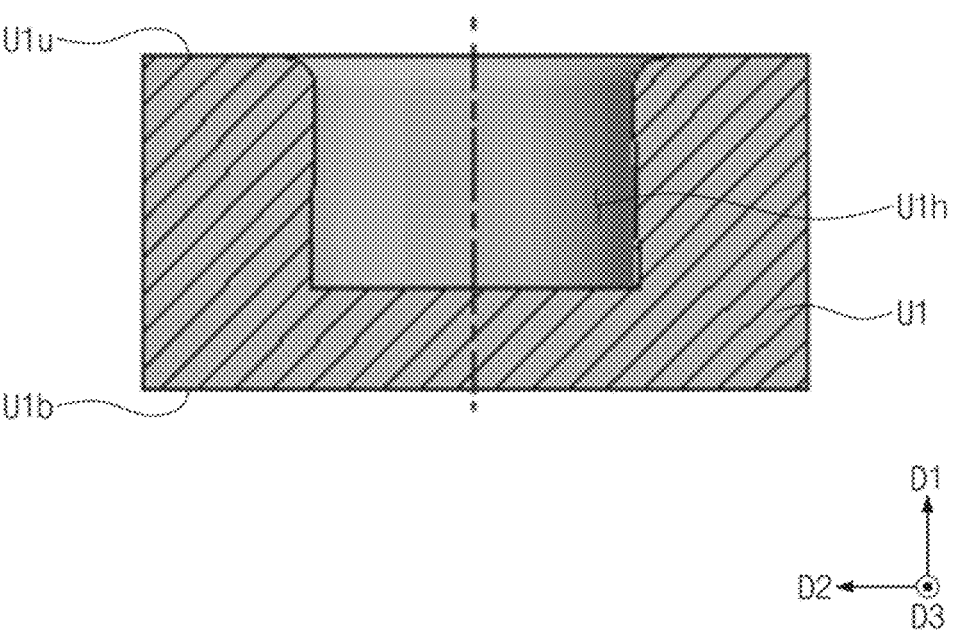
FIG. 4 is a cross-sectional view taken along line D-D shown in FIG. 5 and illustrating a portion of a first electrode plate according to embodiments of the inventive concept.
Figure 5:
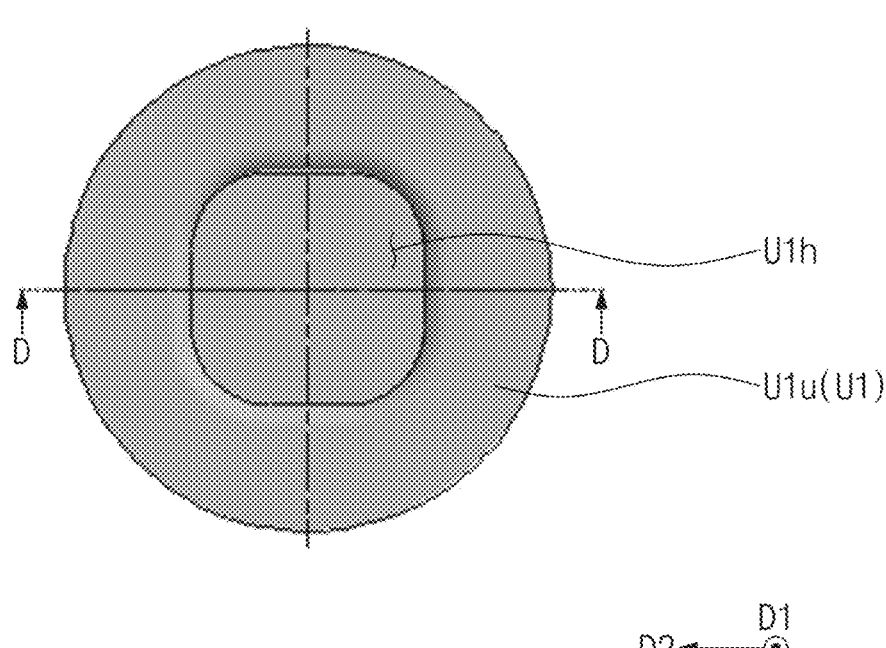
FIG. 5 is a plan view illustrating a portion of the first electrode plate according to embodiments of the inventive concept.

FIG. 3 is a cross-sectional view illustrating a portion of the upper electrode assembling structure according to embodiments of the inventive concept, FIG. 4 is a cross-sectional view illustrating a portion of the first electrode plate according to embodiments of the inventive concept, and FIG. 5 is a plan view illustrating a portion of the first electrode plate according to embodiments of the inventive concept.

Referring to FIGS. 3 to 5, the first insertion hole U1$h$ may be defined by being recessed to a certain depth downward from a top surface U1$u$ of the first electrode plate U1. A height of the first insertion hole U1$h$ may be less than that of the first electrode plate U1. Thus, the first insertion hole U1$h$ may not be connected to a bottom surface U1$b$ of the first electrode plate U1. However, the embodiment of the inventive concept is not limited thereto. The first insertion hole U1h may have a non-circular shape in the plan view. For example, the first insertion hole U1h may have a rounded square shape in the plan view. That is, a circumference of the first insertion hole U1h in the plan view may be a rectangle with rounded corners. However, the embodiment of the inventive concept is not limited thereto. The bush assembly A may be inserted into the first insertion hole U1h. The bush assembly A may include a bush insert 3 and a bush 1. Details about these will be described later.

Figure 6:
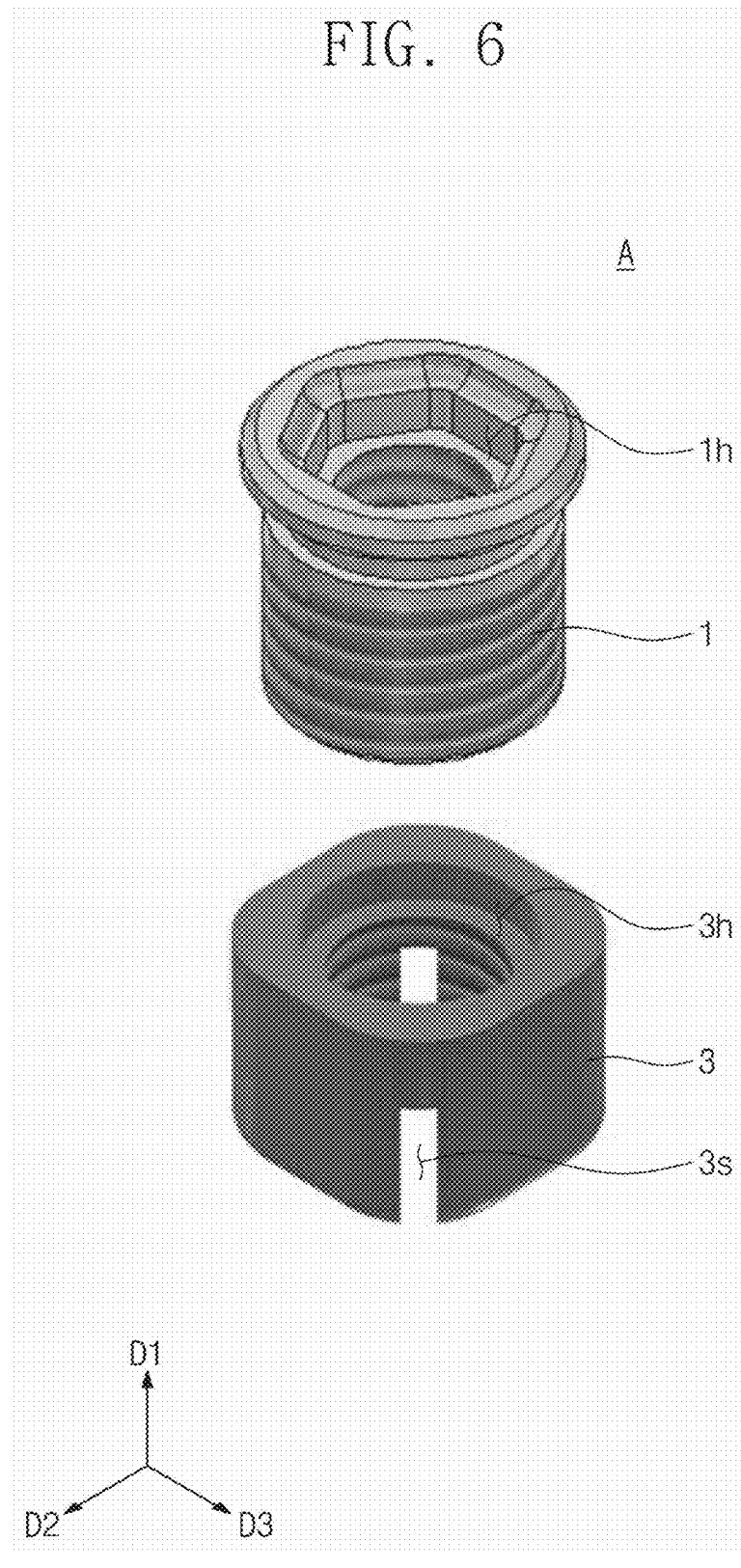
FIG. 6 is an exploded perspective view of a bush assembly according to embodiments of the inventive concept.
Figure 7:
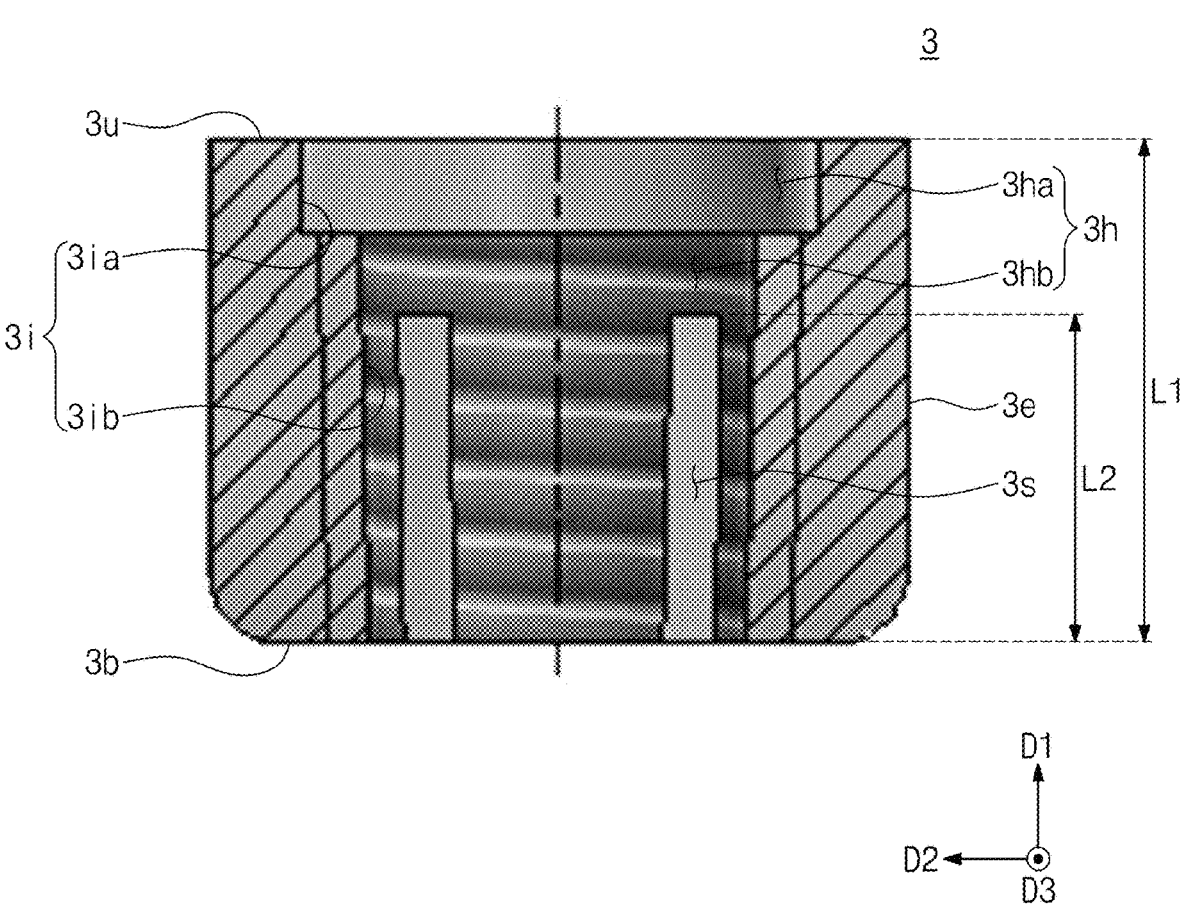
FIG. 7 is a cross-sectional view taken along line A-A shown in FIG. 9 and illustrating a bush insert according to embodiments of the inventive concept.
Figure 8:
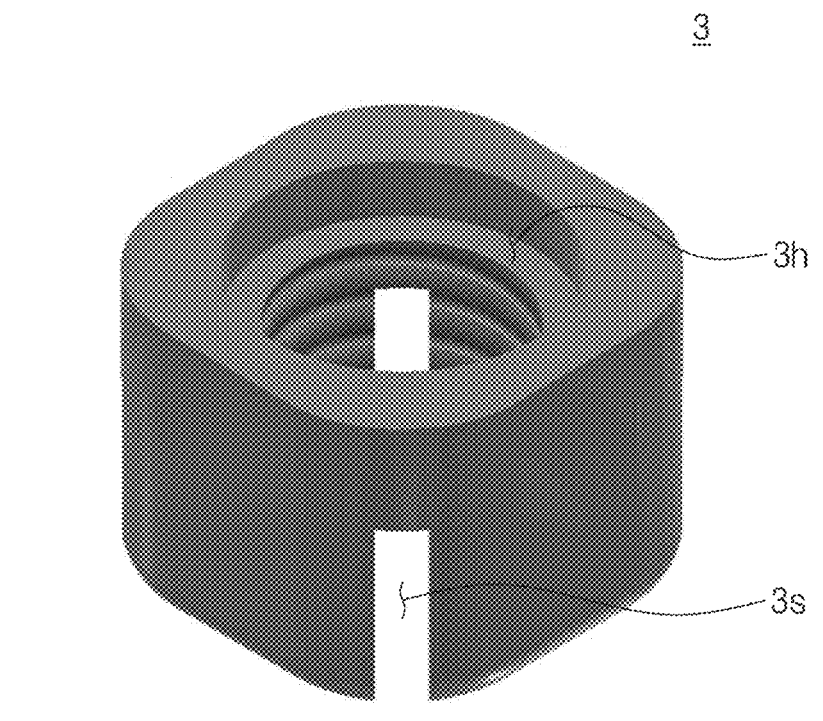
FIG. 8 is a perspective view of the bush insert according to embodiments of the inventive concept.
Figure 8:
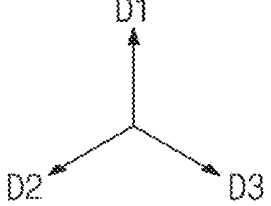
Figure 9:
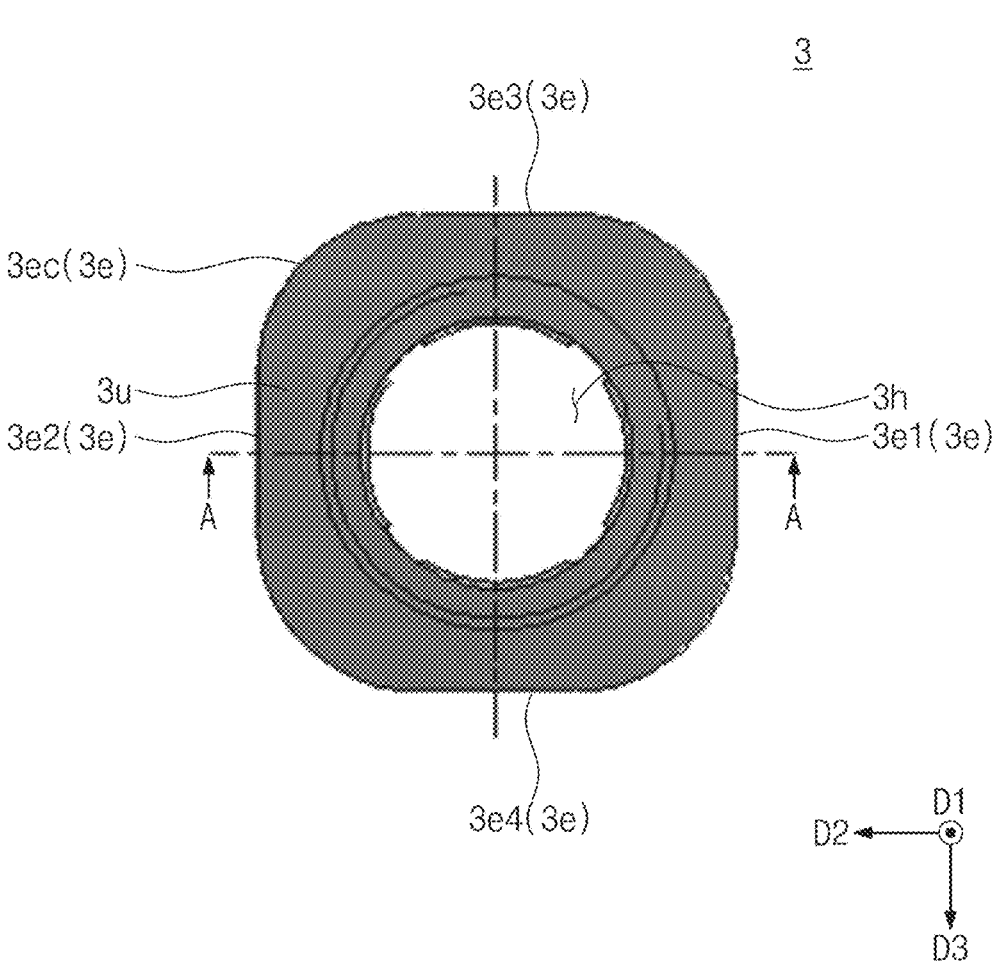
FIG. 9 is a plan view of the bush insert according to embodiments of the inventive concept.
Figure 10:
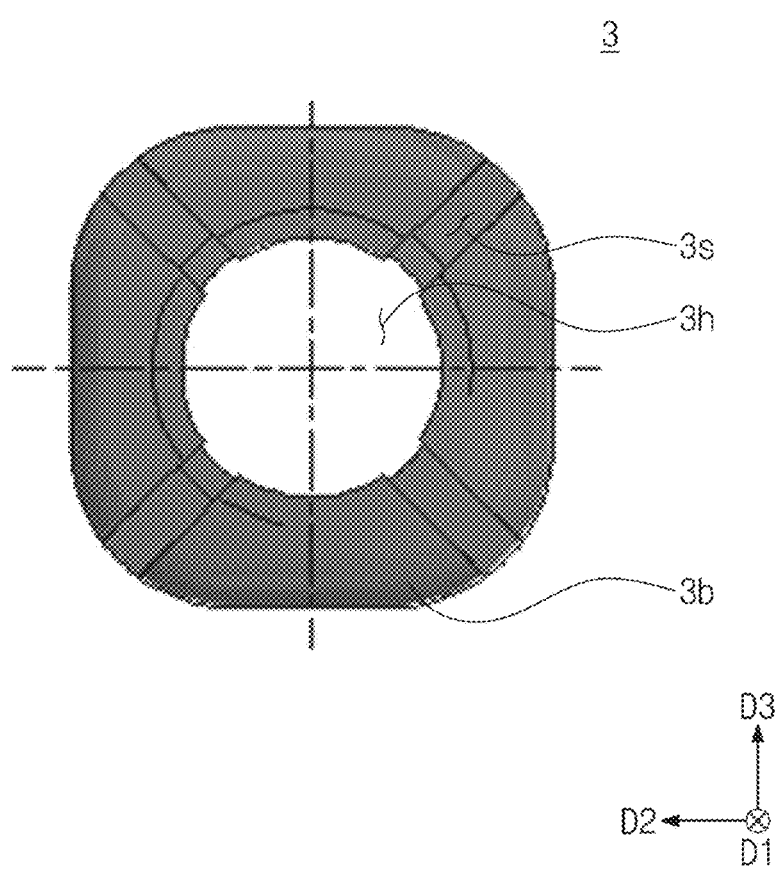
FIG. 10 is a bottom view of the bush insert according to embodiments of the inventive concept.

FIG. 6 is an exploded perspective view of the bush assembly according to embodiments of the inventive concept, FIG. 7 is a cross-sectional view of the bush insert according to embodiments of the inventive concept, FIG. 8 is a perspective view of the bush insert according to embodiments of the inventive concept, FIG. 9 is a plan view of the bush insert according to embodiments of the inventive concept, and FIG. 10 is a bottom view of the bush insert according to embodiments of the inventive concept.

Referring to FIGS. 6 to 8, the bush insert 3 may provide an insert inner hole 3h. The insert inner hole 3h may be defined by be recessed downward from a top surface 3u of the bush insert 3. For example, the insert inner hole 3h may pass through the bush insert 3 in the first direction D1. An inner surface 3i defining the insert inner hole 3h may include a first inner surface 3ib and a second inner surface 3ia. The portion defined by the first inner surface 3ib of the insert inner hole 3h may be referred to as a first inner hole 3hb. The first inner hole 3hb may be defined by being recessed downward from the top surface 3u of the bush insert 3. The first inner hole 3hb may have a circular shape in the plan view. A female screw structure (not shown) may be provided on the first inner surface 3ib. A portion defined by the second inner surface 3ia of the insert inner hole 3h may be referred to as a second inner hole 3ha. The second inner hole 3ha may extend upward from the first inner hole 3hb. The second inner hole 3ha may be connected to the top surface 3u of the bush insert 3. A width of the first inner hole 3hb may be less than or equal to that of the second inner hole 3ha, but is not limited thereto.

Referring to FIGS. 6 to 8 and 10, the bush insert 3 may further provide a shrinkage hole 3s. The shrinkage hole 3s may have a shape defined by cutting a portion of the insert inner hole 3h and extend in a horizontal direction so as to be connected to an outer surface 3e of the bush insert 3. A length L2 of the shrinkage hole 3s in the first direction D1 may be less than a length L1 of the bush insert 3 in the first direction D1. The shrinkage hole 3s may be connected to the bottom surface 3b of the bush insert 3. The shrinkage hole 3s may be provided in plurality. For example, four shrinkage holes 3s may be provided. The plurality of shrinkage holes 3s may be spaced apart from each other in a circumferential direction.

Referring to FIG. 9, the bush insert 3 may have a non-circular shape in the plan view. For example, the bush insert 3 may have a rounded square shape in the plan view. More specifically, a shape of the outer surface 3e of the bush insert 3 may be a square shape with rounded corners in the plan view. That is, the outer surface 3e of the bush insert 3 may include a first outer surface 3e1, a second outer surface 3e2, a third outer surface 3e3, a fourth outer surface 3e4, and a curved surface.

The first outer surface 3e1 may be parallel to a straight line extending in the first direction D1. The first outer surface 3e1 may be a plane. For example, the first outer surface 3e1 may be perpendicular to the second direction D2.

The second outer surface 3e2 may be parallel to a straight line extending in the first direction D1. The second outer surface 3e2 may be a plane. For example, the second outer surface 3e2 may be perpendicular to the second direction D2. The second outer surface 3e2 may be disposed on an opposite side of the first outer surface 3e1. More specifically, the second outer surface 3e2 may be disposed on an opposite side of the first outer surface 3e1 based on the insert inner hole 3h.

The third outer surface 3e3 may be parallel to a straight line extending in the first direction D1. The third outer surface 3e3 may be a plane. For example, the third outer surface 3e3 may be perpendicular to the third direction D3. The third outer surface 3e3 may be disposed between the first outer surface 3e1 and the second outer surface 3e2.

The fourth outer surface 3e4 may be parallel to a straight line extending in the first direction D1. The fourth outer surface 3e4 may be a plane. For example, the fourth outer surface 3e4 may be perpendicular to the third direction D3. The fourth outer surface 3e4 may be disposed on an opposite side of the third outer surface 3e3. More specifically, the fourth outer surface 3e4 may be disposed on an opposite side of the third outer surface 3e3 based on the insert inner hole 3h.

The curved surface may include a first curved surface 3ec. The first curved surface 3ec may connect the third outer surface 3e3 to the second outer surface 3e2. Three or more curved surfaces may be provided. That is, each of the four curved surfaces may connect two adjacent outer surfaces of the four outer surfaces to each other. However, it is not limited thereto, and the outer surface 3e of the bush insert 3 may have a hexagonal shape with rounded corners or an octagonal shape with rounded corners in the plan view.

Figure 11:
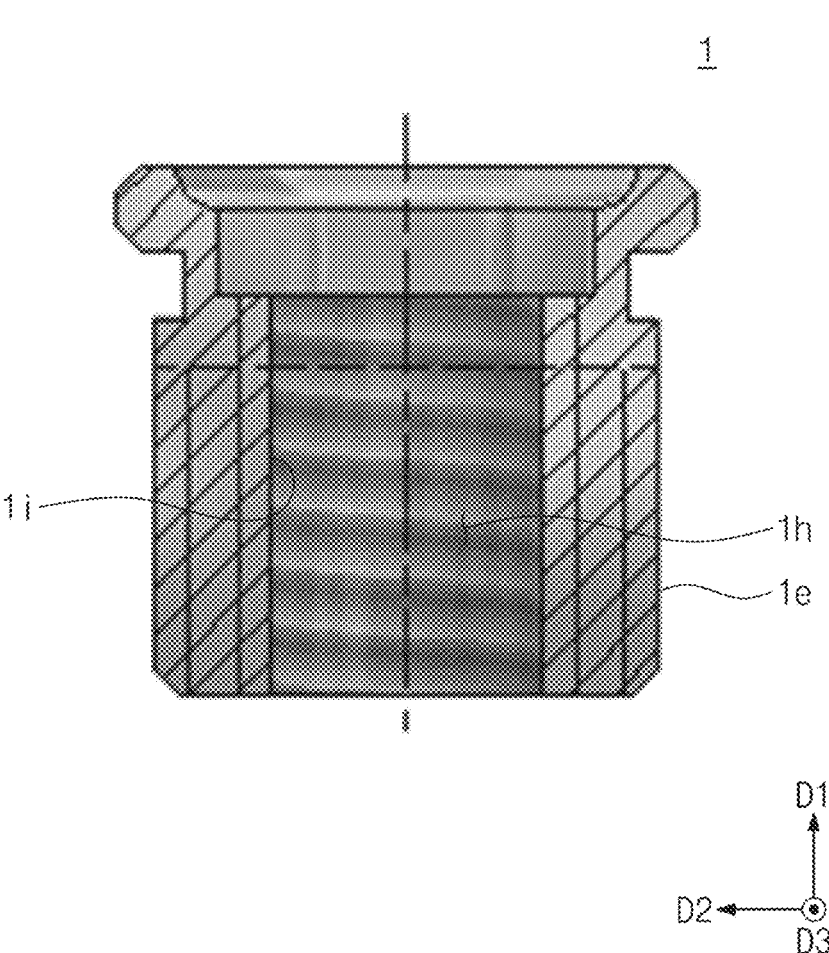
FIG. 11 is a cross-sectional view taken along line B-B shown in FIG. 12 and illustrating a bush according to embodiments of the inventive concept.
Figure 12:
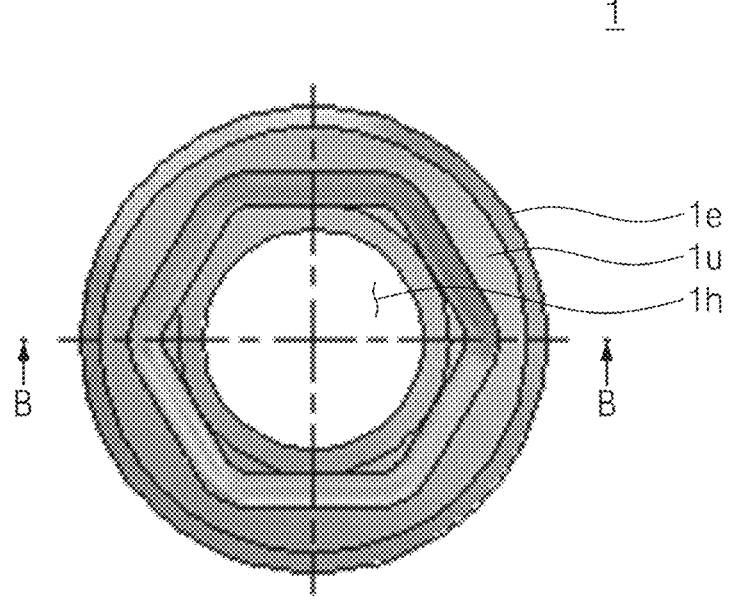
FIG. 12 is a plan view of the bush according to embodiments of the inventive concept.
Figure 12:
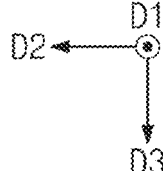

FIG. 11 is a cross-sectional view of the bush according to embodiments of the inventive concept, and FIG. 12 is a plan view of the bush according to embodiments of the inventive concept.

Referring to FIGS. 10, 11, and 12, the bush 1 may provide an internal through-hole 1h. The internal through-hole 1h may be defined by being recessed to a certain depth downward from a top surface 1u of the bush 1. For example, the internal through-hole 1h may pass through the bush 1 in the first direction D1. An inner surface 1i of the bush 1 defining the internal through-hole 1h may provide a female screw structure. An outer surface 1e of the bush 1 may have a circular shape in the plan view. A male screw structure (not shown) may be provided on the outer surface 1e of the bush 1. The external screw structure provided on the outer surface 1e of the bush 1 may be engaged with the female screw structure provided on the first inner surface 3ib (see FIG. 7) of the bush insert 3 (see FIG. 7) that defines the insert inner hole 3h (see FIG. 7).

In the bush insert, the bush assembly including the same, and the upper electrode assembling structure including the same according to the embodiments of the inventive concept, each of the bush insert and the first insertion hole may have the non-circular shape in the plan view. Therefore, the bush insert may be prevented from rotating within the first insertion hole. Therefore, the bush insert may be easily and quickly coupled to the first electrode plate.

In the bush insert, the bush assembly including the same, and the upper assembling structure including the same according to the embodiments of the inventive concept, the rotation may be prevented.

In the bush insert, the bush assembly including the same, and the upper assembling structure including the same according to the embodiments of the inventive concept, the simple assembly may be realized.

The effects of the inventive concept invention are not limited to the aforementioned object, but other effects not described herein will be clearly understood by those skilled in the art from descriptions below.

Although the embodiment of the present invention is described with reference to the accompanying drawings, those with ordinary skill in the technical field of the present invention pertains will be understood that the present invention can be carried out in other specific forms without changing the technical idea or essential features. Thus, the above-disclosed embodiments are to be considered illustrative and not restrictive.

What is claimed is:

1. A bush insert coupled to a plasma electrode plate, wherein the bush insert is configured to provide an insert inner hole that passes through the bush insert in a first direction, an inner surface of the bush insert that defines the insert inner hole is configured to provide a female screw structure, and an outer surface of the bush insert has a non-circular shape in a plan view, wherein the bush insert further comprises a shrinkage hole extending from the insert inner hole in a horizontal direction crossing the first direction and connected to the outer surface of the bush insert, wherein a length of the shrinkage hole in the first direction is less than a length of the insert inner hole in the first direction.

2. The bush insert of claim 1, wherein the insert inner hole comprises:

a second inner hole recessed downward from a top surface of the bush insert; and a first inner hole extending downward from the second inner hole and connected to a bottom surface of the bush insert, wherein the inner surface of the bush insert includes a first inner surface and a second inner surface, and the female screw structure is provided on the first inner surface of the bush insert that defines the first inner surface.

3. The bush insert of claim 2, wherein the first inner hole has a circular shape in the plan view.

4. The bush insert of claim 1, wherein the outer surface of the bush insert comprises:

a first outer surface parallel to the first direction;

a second outer surface disposed at an opposite side of the first outer surface based on the insert inner hole;

a third outer surface between the first outer surface and the second outer surface; and a fourth outer surface disposed at an opposite side of the third outer surface based on the insert inner hole, wherein each of the first outer surface, the second outer surface, the third outer surface, and the fourth outer surface has a plane shape.

5. The bush insert of claim 4, wherein the outer surface of the bush insert further comprises a first curved surface configured to connect the second outer surface to the third outer surface.

6. An upper electrode assembling structure comprising:

a first electrode plate; and a bush assembly coupled to the first electrode plate, wherein the first electrode plate is configured to provide a first insertion hole that is recessed to a predetermined depth downward from a top surface of the first electrode plate, and the bush assembly comprises:

a bush; and a bush insert coupled to the bush so as to surround the bush, wherein each of the first insertion hole and the bush insert has a rounded square shape in a plan view, and the bush insert is inserted into the first insertion hole.

7. The upper electrode assembling structure of claim 6, further comprising a second electrode plate on the first electrode plate.

8. The upper electrode assembling structure of claim 6, wherein the bush insert is configured to provide an insert inner hole that vertically passes through the bush insert, wherein an inner surface of the bush insert that defines the insert inner hole is configured to provide a female screw structure, and the bush is screw-coupled to the female screw structure.

9. The upper electrode assembling structure of claim 8, wherein the insert inner hole has a circular shape in the plan view.

10. The upper electrode assembling structure of claim 8, wherein the insert inner hole comprises:

a second inner hole recessed downward from a top surface of the bush insert; and a first inner hole extending downward from the second inner hole and connected to a bottom surface of the bush insert, wherein the second inner hole has a width greater than a width of the first inner hole.

11. The upper electrode assembling structure of claim 8, wherein the bush insert is configured to further provide a shrinkage hole extending from the insert inner hole in a horizontal direction crossing a first direction and connected to an outer surface of the bush insert.

12. The upper electrode assembling structure of claim 11, wherein a length of the shrinkage hole in the first direction is less than a length of the insert inner hole in the first direction, wherein the shrinkage hole is connected to a bottom surface of the bush insert.

13. The upper electrode assembling structure of claim 11, wherein the shrinkage hole comprises four shrinkage holes, wherein the four shrinkage holes are defined to be spaced apart from each other in a circumferential direction.

14. A bush assembly comprising:

a bush insert; and a bush inserted into the bush insert, wherein the bush is configured to provide an internal through-hole that passes through the bush in a first direction, a male screw structure is provided on an outer surface of the bush, the bush insert is configured to provide an insert inner hole that passes through the bush insert in the first direction, an inner surface of the bush insert that defines the insert inner hole is configured to a female screw structure engaged with the male screw structure, an outer surface of the bush insert has a non-circular shape in a plan view, and an outer surface of the bush has a circular shape in the plan view.

15. The bush assembly of claim 14, wherein the outer surface of the bush insert has a rounded square shape in the plan view.

16. The bush assembly of claim 14, wherein the bush insert is configured to further provide a plurality of shrinkage holes extending from the insert inner hole in a horizontal direction crossing the first direction and connected to the outer surface of the bush insert.

17. The bush assembly of claim 14, wherein the insert inner hole comprises:

a second inner hole recessed downward from a top surface of the bush insert; and a first inner hole extending downward from the second inner hole and connected to a bottom surface of the bush insert.

\*   \*   \*   \*   \*